(12) United States Patent
Kumaki

(10) Patent No.: US 6,549,598 B1
(45) Date of Patent: Apr. 15, 2003

(54) CLOCK SIGNAL EXTRACTION CIRCUIT

(75) Inventor: Norio Kumaki, Ohra-gun (JP)

(73) Assignee: Advantest Corp., Tokyo (JP)

( * ) Notice: Subject to any disclaimer, the term of this patent is extended or adjusted under 35 U.S.C. 154(b) by 0 days.

(21) Appl. No.: 09/338,234

(22) Filed: Jun. 22, 1999

(30) Foreign Application Priority Data

Jun. 22, 1998 (JP) .......................................... 10-174263

(51) Int. Cl.⁷ .............................................. H03D 13/00
(52) U.S. Cl. ...................... 375/376; 375/226; 375/375; 375/376; 370/229; 370/242
(58) Field of Search ................. 375/224, 226, 375/376, 371, 373, 375; 370/242, 229

(56) References Cited

U.S. PATENT DOCUMENTS 6,295,272 B1 * 9/2001 Feldman et al. ............ 370/203

* cited by examiner

*Primary Examiner*—Chi Pham
*Assistant Examiner*—Pankaj Kumar
(74) *Attorney, Agent, or Firm*—Muramatsu & Associates

(57) ABSTRACT

A clock signal extraction circuit extracts clock information from the received data and reproducing the clock signal. The clock signal extraction circuit includes an input terminal for receiving serial data having time periods each being an integer multiple of a fundamental time period of a clock signal to be reproduced, a delay element for providing a predetermined delay time to the serial data, a voltage controlled oscillator (VCO) whose oscillaticon frequency is regulated by a control signal voltage for producing the clock signal, a latch circuit for latching the serial data at the timing cf the clock signal from the VCO, a phase comparator for comparing the serial data from the delay element and the latched serial data from the latch circuit and generating a detection signal representing a phase difference therebetween, and a PLL for feed-backing the detection signal to the VCO as the control signal voltage.

18 Claims, 6 Drawing Sheets

CLOCK SIGNAL EXTRACTION CIRCUIT

FIELD OF THE INVENTION

This invention relates to a clock signal extraction circuit which receives serial data having clock information therein and extracts the clock information to reproduce a clock signal that is synchronized with the serial data, and more particularly, to a clock signal extraction circuit which extracts the clock information based on each edge of the serial data rather than the information contained in a synchronous signal to reproduce a clock signal.

BACKGROUND ART OF THE INVENTION

In a digital communication system, for example, a receiver has to extract clock information from the received data and regenerate a clock signal to accurately and properly utilize the received data. An example of conventional technology of such a clock signal extraction circuit is shown in FIG. 3. An Example of FIG. 3 is basically a PLL (phase lock loop) oscillation circuit. FIGS. 4A–4H are timing charts showing the operation of the clock signal extraction circuit of FIG. 3.

In the timing chart of FIG. 4, it is assumed that the transmitted data (FIG. 4C) has an RZ (return-to-zero) waveform which is produced by transmitter data (FIG. 4A) and a transmitter clock signal (FIG. 4B). It is also assumed that the clock signal extraction circuit of FIG. 3 is to extract the clock information from the synchronous signal $S_{ync}$ of period 3T in the serial data where a time period T is a time length of one clock cycle.

Thus, the receiver receives the transmitted serial data D1 from which the clock signal extraction circuit of FIG. 3 is to produce a clock signal CK1 of FIG. 4H. In the example of FIG. 3, the clock signal extraction circuit comprises a voltage controlled oscillator (VCO) 60, a frequency divider 62, a phase comparator 70, a low pass filter (LPF) 72, an edge detector 50, a single period (T) filter 52, and a double period (2T) filter 54. A negative feedback loop, i.e., a PLL is formed by returning the output of the phase comparator 70 to the VCO 60 through the low pass filter 72.

The VCO 60 is a voltage-controlled oscillator which oscillates at a frequency close to the frequency of the clock signal in the transmitter that is to be reproduced. The frequency of the voltage controlled oscillator can be varied by regulating the voltage provided thereto. As is well known in the art, such a voltage controlled oscillator is formed by various manners including an LC oscillator in which a variable capacitor diode is incorporated, a voltage controlled crystal oscillator having a fine tuning capability, and the like.

The phase comparator 70 produces a control signal 71 whose voltage indicates the phase difference between the two input signals. The control signal 71 is filtered (averaged) by the LPF 72 so that the VCO 60 receives a control signal 73 from the LPF 72. The oscillation frequency of the VCO 60 is controlled by the voltage of the control signal 73 to decrease the phase difference at input of the phase comparator, i.e. phase lock the VCO 60. As is well known in the art, the LPF 72 defines loop characteristics of the PLL circuit such as a loop gain, a loop band with and a pull-in range. In the foregoing arrangement, the clock signal is extracted and reproduced by the PLL circuit as a clock signal CK1 at the output of the VCO 60.

The edge detector 50 receives the coded serial data D1 shown in FIG. 4C, and converts the front (leading) and back (trailing) edges of the received data into a pulse signal D2 shown in FIG. 4D. The single period filter 52 receives the pulse signal D2 from the edge detector 50 and removes the pulses having a fundamental time period T. Thus, the output of the single period filter 52 is a remaining pulse signal D3 shown in FIG. 4E. The double period filter 54 receives the pulse signal D3 from the single period filter 52 and removes the pulses having the time period 2T which is two times of the fundamental period T. Thus, at the output of the double period filter 54, a remaining pulse signal D4 shown in FIG. 4F is produced which includes the synchronous signal having the clock information showing the time period 3T.

Based on the synchronous signal having the period 3T, the clock signal extraction circuit of FIG. 3 extracts the clock information of the fundamental time period T and generates the clock signal CK1 having the time period T. The synchronous signal D4 is provided to the input of the phase comparator 70 from the double period filter 54. At another input, the phase comparator 70 receives an output signal CK2 from the frequency divider 62.

In this case, the frequency divider 62 divides the clock signal CK1 from the VCO 60 into three so that the output signal CK2 has a time period of 3T to be synchronized with the synchronous signal $S_{ync}$ having the period 3T from the double period filter 54. As noted above, the PLL circuit operates to minimize the phase difference between the two input signals of the phase comparator 70 by regulating the oscillation frequency (phase) of the VCO 60. In this manner, the clock signal CK1 is extracted and reproduced at the output of the VCO 60.

In the foregoing conventional clock signal extraction circuit of FIG. 3, since the phase comparator 70 compares the phase of the pulse signal D4, which is the synchronous signal $S_{ync}$ from the double period filter 54 with the phase of the divided clock signal CK2, it involves the following disadvantages. First, a relatively complex circuit is necessary which includes the edge detector 50, the single period filter 52, and double period filter 54. Thus, it is not appropriate to decrease the size and cost of the clock extraction circuit.

Second, the phase comparison is performed only on the synchronous signal $S_{ync}$ because the pulse signal D4 from the double period filter 54 is provided to the input of the phase comparator 70. Thus, if the pulse signal D4 involves relatively large jitters or phase fluctuations, the clock signal CK1 reproduced PLL circuit may not have sufficient signal quality even when the LPF (low pass filter) 72 is properly adjusted.

Moreover, the division ratio of the frequency divider 62 must be known in advance to accommodate the difference in the time periods between the clock signal to be generated and the synchronous signal received. Further, the serial data needs to include the pulse signal D4 including the synchronous signal that can be compared with the output of the voltage controlled oscillator in the PLL circuit. As noted above, the clock signal extraction circuit in the conventional technology has several drawbacks in the practical use.

SUMMARY OF THE INVENTION

Therefore, it is an object of the present invention to provide a clock signal extraction circuit that can compare phase of the voltage controlled oscillator output with each edge of the serial data having clock information.

It is another object of the present invention to provide a clock signal extraction circuit which is capable of achieving a high stability operation in the clock extraction and reproduction process by increasing a phase comparator gain of the phase lock loop.

It is a further object of the present invention to provide a clock signal extraction circuit which is capable of achieving a high signal-to-noise ratio so that the produced clock signal is not affected by noise superimposed on the received data.

It is a further object of the present invention to provide a clock signal extraction circuit which is formed with a relatively simple structure, thereby achieving a low cost and small size.

In the present invention, the clock signal extraction circuit is comprised of an input terminal for receiving serial data having time periods each of which is an integer multiple of a fundamental time period of a clock signal to be reproduced, a delay element for providing a predetermined delay time to the serial data from the input terminal, a voltage controlled oscillator whose oscillation frequency is regulated by a control signal voltage for producing the clock signal, means for latching the serial data at the timing of the output signal of the voltage controlled oscillator, a phase comparator for comparing the serial data from the delay element and the latched serial data from the latching means and generating a detection signal representing a phase difference therebetween, and means for feed-backing the detection signal to the voltage controlled oscillator as the control signal voltage to minimize the phase difference between the data compared by the phase comparator.

According to the configuration of the present invention, by using either one of the leading or trailing edge of the serial data D1, or both of the leading and trailing edges of the serial data D1, the phase comparison with the phase of the VCO output signal is performed in a continuous manner. Therefore, high operational stability is achieved in the clock signal extraction circuit. In addition, since the synchronous signal $S_{ync}$ of known time period is unnecessary, the present invention can reproduce a clock signal for serial data of unknown repetition rate or random serial data.

Since a large number of edges of the serial data D1 is used in the phase comparison operation as noted above, the phase comparator gain, i.e., the loop gain of the PLL circuit, becomes sufficiently high. Thus, the PLL circuit can reach the phase lock state in a short time. Further, since the loop gain is high, the S/N ratio is also high, thereby being able to produce the clock signal with high stability. Further, even when jitters exist in the serial data D1, since the large number of edges are used as noted above, effects by such jitters can be reduced by averaging the jitters. Moreover, the clock signal extraction circuit of the present invention can be formed with a relatively simple circuit configuration in the foregoing, resulting in the low cost and small size.

DETAILED DESCRIPTION OF THE EMBODIMENTS

Figure 1:
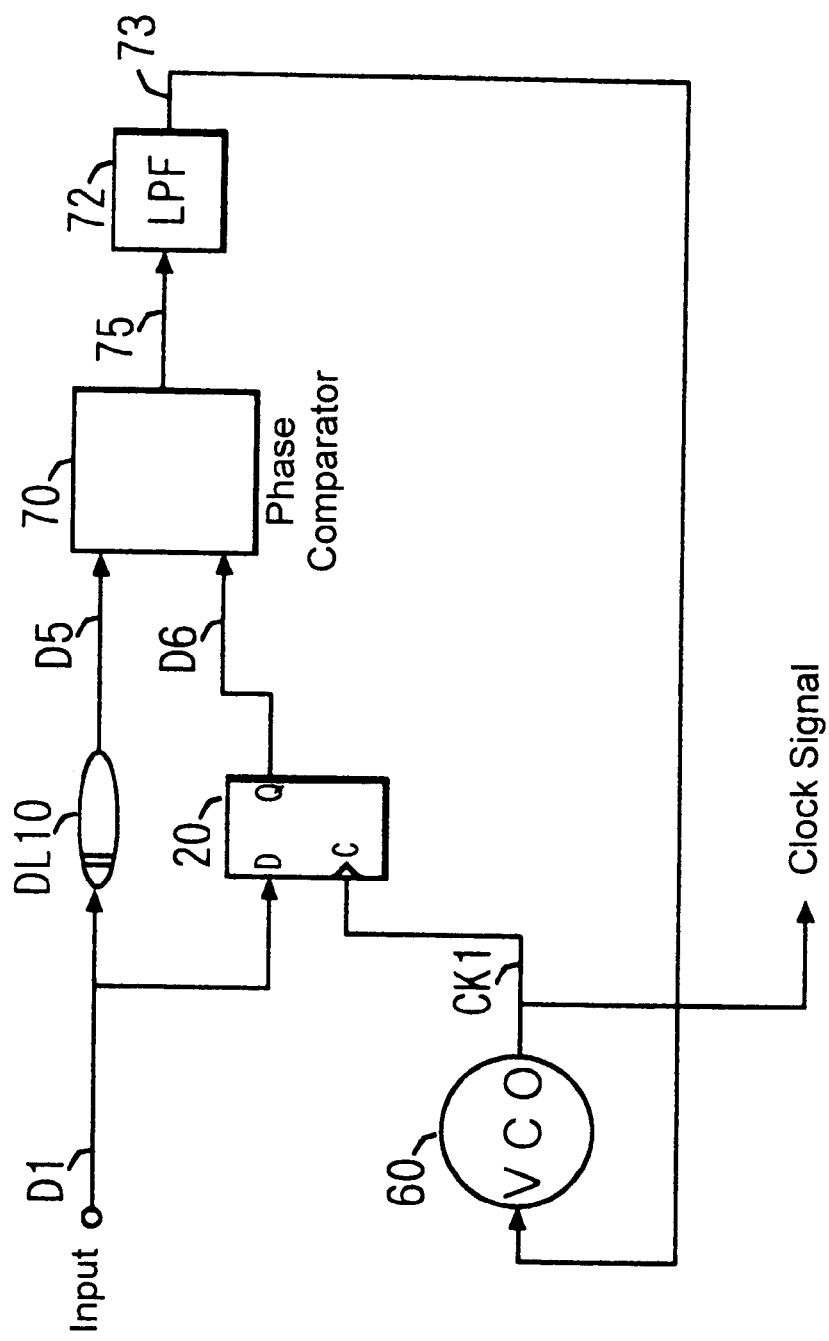
FIG. 1 is a circuit diagram showing an example of circuit configuration of the clock signal extraction circuit of the present invention.
Figure 2:
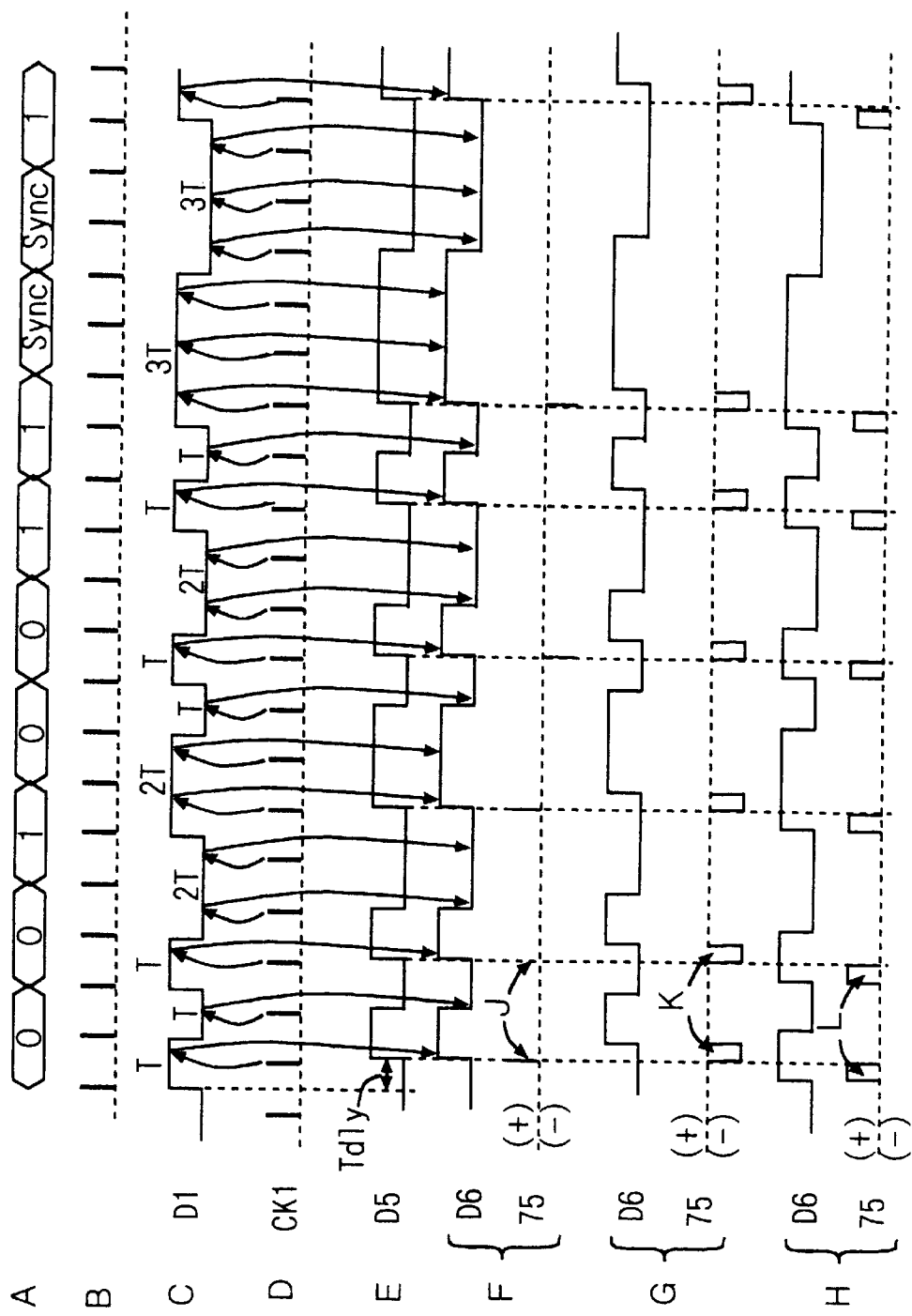
FIG. 2 is a timing chart showing the operation of the clock signal extraction circuit of the present invention for extracting and reproducing the clock signal.
Figure 3:
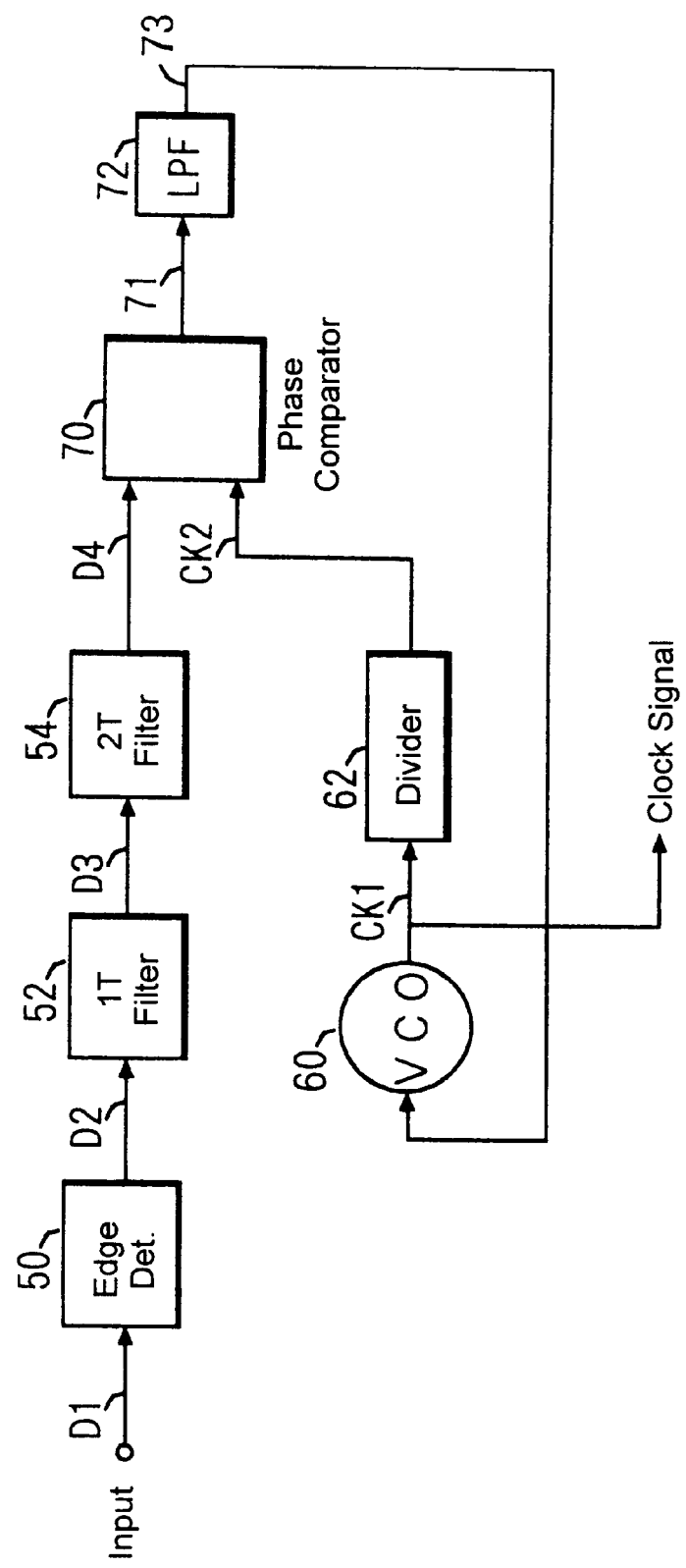
FIG. 3 is a circuit diagram showing an example of circuit configuration of the conventional clock signal extraction circuit.
Figure 4:
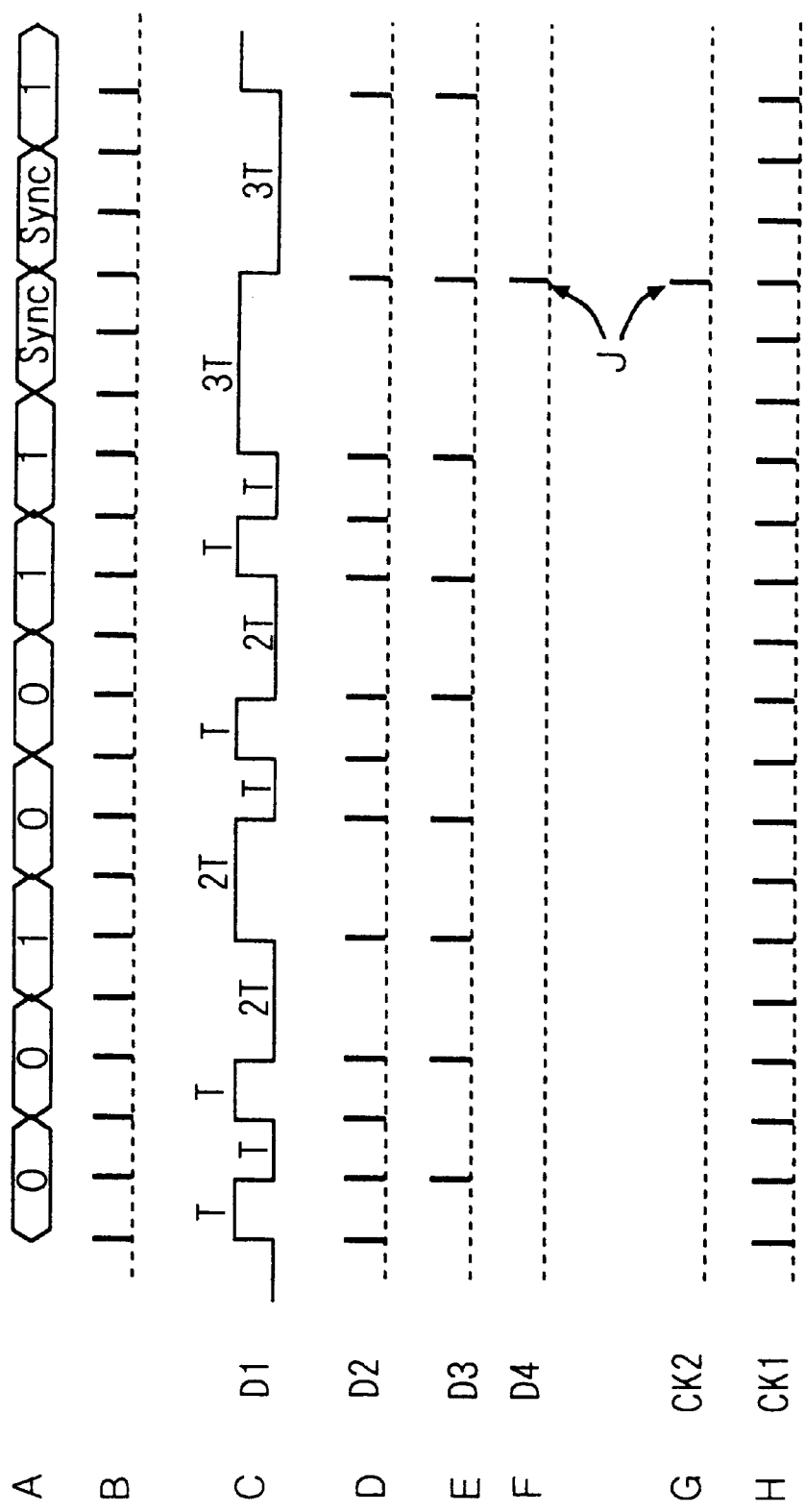
FIG. 4 is a timing chart showing the operation of the conventional clock signal extraction circuit of FIG. 3.

The present invention is explained with reference to the drawings. The embodiment of the clock signal extraction circuit is shown in FIG. 1 wherein a PLL oscillation circuit is incorporated to detect and reproduce the clock signal. The operation of the clock signal extraction circuit of FIG. 1 is shown in the timing chart of FIG. 2. In FIGS. 1 and 2, identical components and signals are denoted by the same reference labels used in the conventional examples of FIGS. 3 and 4.

As shown in FIG. 1, the clock signal extraction circuit of the present invention includes a voltage controlled oscillator (VCO) 60, a phase comparator 70, a low pass filter (LPF) 72, a delay element DL10, and a flip-flop 20. In this configuration, the phase comparator 70, the VCO 60 and the LPF 72 are identical to those in the conventional example of FIG. 3, thus, no further explanation is given here regarding these components.

The delay element DL10 receives a serial data D1, and provides a predetermined delay time $T_{dly}$ to the data D1. The serial data D1 in this case has an RZ (return-to-zero) waveform as shown in FIG. 2C. The phase comparator 70 receives the delayed data D5 from the delay element DL10 at one input terminal. The waveform of FIG. 2C represents the serial data D1 at the input terminal and the waveform of FIG. 2E represents the delayed signal D5 from the delay element DL10 having the delay time $T_{dly}$. The other input terminal of the phase comparator 70 is connected to the output of the flip-flop 20.

In order to properly perform the operation of phase comparison by the phase comparator 70, the delay time $T_{dly}$ should be adjusted to be greater than the sum of a set-up time and a signal propagation delay time of the flip-flop 20 and a jitter length superimposed on the serial data D1. The delay element DL10 can be formed by a passive delay line such as a coaxial cable or a micro-strip line as well as an active component such as a series connected semiconductor gate circuits such as CMOS gates.

As shown in FIG. 1, the flip-flop 20 is a D-type flip-flop and is provided with a clock signal CK1 of FIG. 2D at the clock terminal C. The clock signal CK1 is generated by the VCO 60. At the data terminal D, the flip-flop 20 is provided with the serial data D1. Accordingly, the serial data D1 is latched by the flip-flop 20 at the timing of the clock signal CK1. In other words, the flip-flop 20 performs a re-timing operation with reference to the clock signal CK1 for the serial data D1 and provides the re-timed signal D6 shown in FIG. 2F (output Q) to the other comparison input terminal of the phase comparator 70.

In operation, since it is configured with a negative feed-back loop, the PLL circuit functions to decrease the phase difference between the two input signals of the phase comparator 70. FIG. 2G shows a situation where the phase of the clock signal CK1 is advanced relative to the data D5. Because of this phase difference, the phase difference signal 75 at the output of the phase comparator 70 shows a negative pulse K representing the phase difference. By averaging the pulse K with the low pass filter 72 and feed-backing the resultant DC voltage to the VCO 60, the PLL circuit operates to decrease the oscillation frequency of the VCO 60 to delay the phase, which minimizes the phase difference.

FIG. 2H shows a situation where the phase of the clock signal CK1 is retarded relative to the data D5. Because of this phase difference, the phase difference signal 75 at the output of the phase comparator 70 shows a positive pulse I representing the phase difference. By averaging the pulse I with the low pass filter 72 and feed-backing the resultant DC voltage to the VCO 60, the PLL circuit operates to increase the oscillation frequency of the VCO 60 to advance the phase, which minimizes the phase difference. Accordingly, FIG. 2F shows a situation where the phase lock is established in the PLL circuit of FIG. 1.

According to the configuration described in the foregoing, since the continuous phase comparison is performed by using either one of leading or trailing edges of the serial data D1, the gain of the phase comparator 70, i.e., the loop gain of the PLL circuit, is large. Thus, the phase lock can be established in a relatively short time. In addition, because the phase comparator gain is large, an S/N (signal-to-noise) ratio in the phase comparator 70, the low pass filter 72, and the VCO 60 can be improved. As a result, the operational stability in the clock signal extraction circuit is improved. Further, since the synchronous signal $S_{ync}$ for the phase lock operation is unnecessary, a clock signal can be reproduced even when the time period of the original clock is unknown. Moreover, because the circuit configuration is relatively simple, it is possible to reduce the cost and size of the clock extraction circuit.

Figure 6:
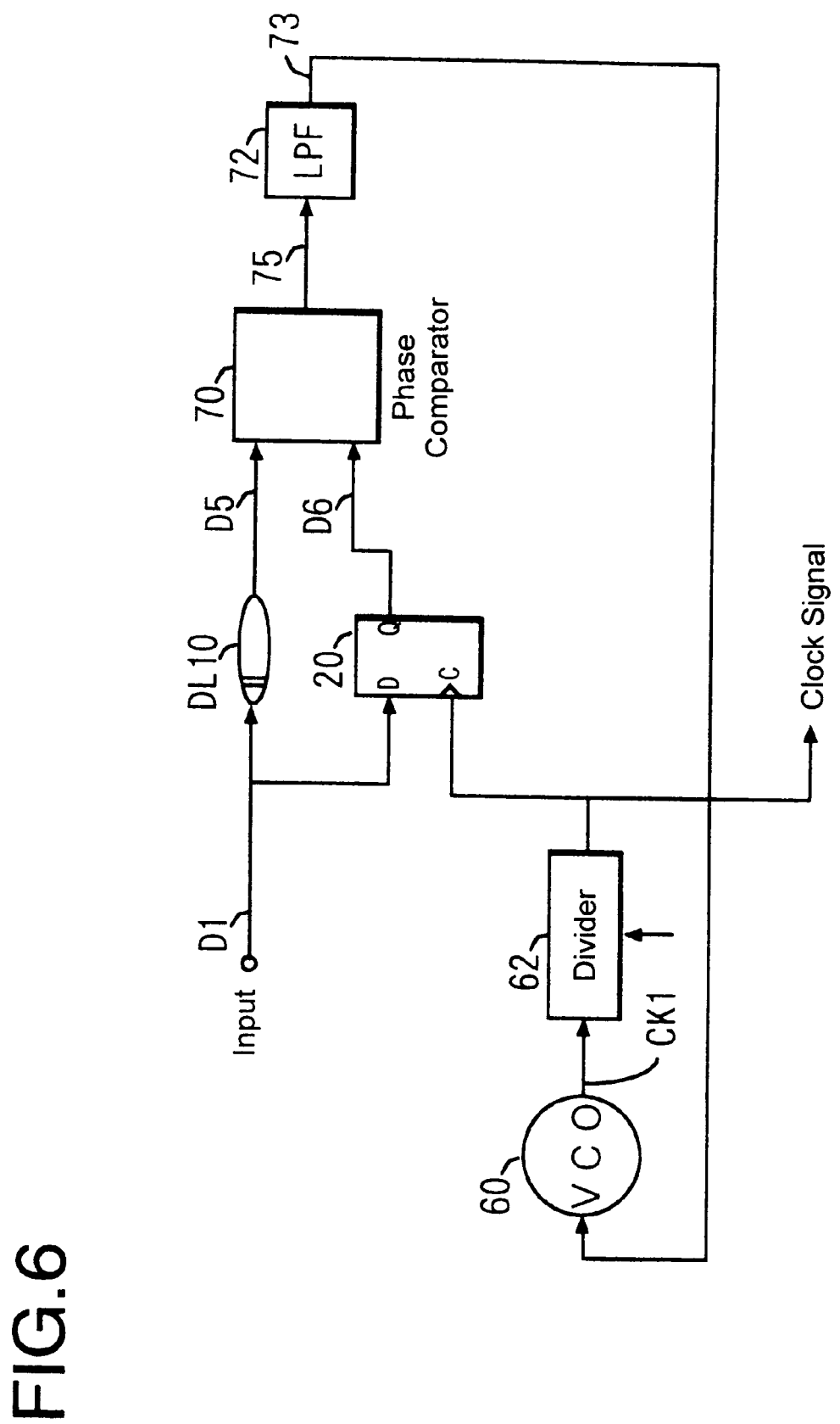
FIG. 6 is a circuit diagram showing a further example of circuit configuration of the clock signal extraction circuit of the present invention.

The present invention is not limited to the embodiment described above. As shown in the configuration of FIG. 6, a frequency divider 62 which can establish a division ratio may be provided at the output of the voltage controlled oscillator (VCO) 60 while the oscillation frequency of the VCO 60 may be increased in proportion to the division ratio of the frequency divider 62. In this example, the intended clock signal is produced at the output of the frequency divider 62 which is also provided to the phase comparator 70 via the flip-flop 20.

Figure 5:
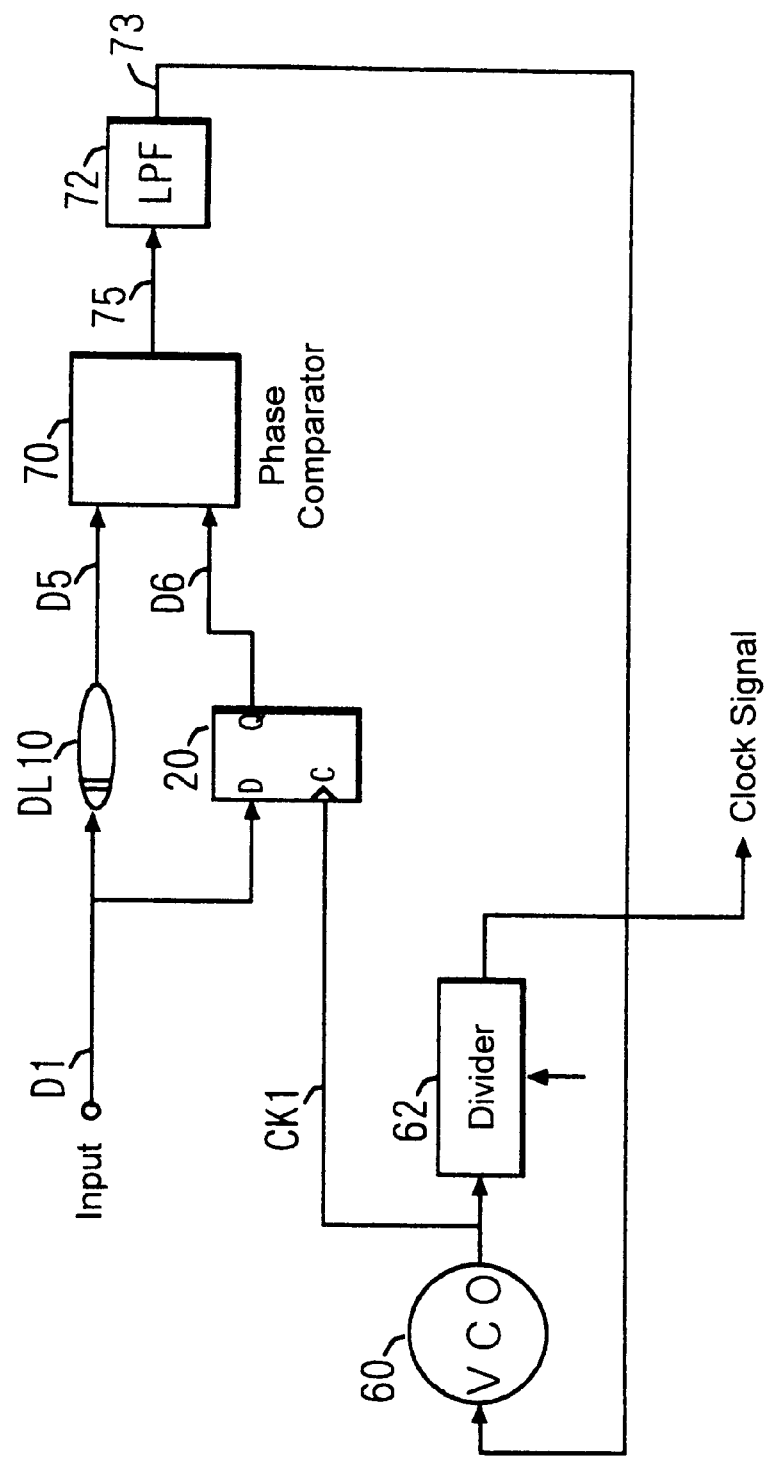
FIG. 5 is a circuit diagram showing another example of circuit configuration of the clock signal extraction circuit of the present invention.

Further, as shown in the configuration of the FIG. 5, a frequency divider 62 which can establish a division ratio may be provided at the output of the voltage controlled oscillator (VCO) 60 while the oscillation frequency of the VCO 60 may be increased in proportion to the division ratio of the frequency divider 62. In this example, the intended clock signal is produced at the output of the frequency divider 62 while the output of the VCO 60 is provided to the phase comparator 70 via the flip-flop 20 without being divided the frequency. In this example, the clock signal can accommodate a wider range of clock frequency because the intended clock signal can be obtained by setting the division ratio of the frequency divider 62.

The phase comparison by the phase comparator 70 may be made by using both the leading edge and the trailing edge of the serial data D1. By using all of the changing points (edges) of the serial data D1, the phase comparison gain, i.e., the loop gain of the PLL circuit, is further increased. Accordingly, the S/N ratio further increases, and the more stable operation can be achieved in the clock signal extraction circuit of the present invention.

The VCO 60 can be various types, such as a voltage-controlled oscillator using an L/C resonance circuit where a capacitance is varied by regulating a variable capacitor diode, a voltage-controlled crystal oscillator using a crystal resonator or a ceramic resonator where a voltage control terminal is provided, or an R/C oscillator wherein an R/C network is used for phase shift and a varactor diode is incorporated therein to regulate the phase shift.

According to the configuration of the present invention described above, by using either one of the leading or trailing edge of the serial data D1, or both of the leading and trailing edges of the serial data D1, the phase comparison with the phase of the VCO output signal is performed in a continuous manner. Therefore, high operational stability is achieved in the clock signal extraction circuit. In addition, since the synchronous signal $S_{ync}$ of known time period is unnecessary, the present invention can reproduce a clock signal for serial data of unknown repetition rate or random serial data.

Since a large number of edges of the serial data D1 is used in the phase comparison operation as noted above, the phase comparator gain, i.e., the loop gain of the PLL circuit, becomes sufficiently high. Thus, the PLL circuit can reach the phase lock state in a short time. Further, since the loop gain is high, the S/N ratio is also high, thereby being able to produce the clock signal with high stability. Further, even when jitters exist in the serial data D1, since the large number of edges are used as noted above, effects by such jitters can be removed by averaging the jitters. Moreover, the clock signal extraction circuit of the present invention can be formed of the relatively simple circuit configuration in the foregoing, resulting in the low cost and small size.

Although only a preferred embodiment is specifically illustrated and described herein, it will be appreciated that many modifications and variations of the present invention are possible in light of the above teachings and within the purview of the appended claims without departing the spirit and intended scope of the invention.

What is claimed is:

1. A clock signal extraction circuit, comprising:
   an input terminal for receiving serial data having time periods each being an integer multiple of a fundamental time period of a clock signal to be reproduced;
   a delay element for providing a predetermined delay time to the serial data from the input terminal;
   a voltage controlled oscillator whose oscillation frequency is regulated by a control signal voltage for producing the clock signal;
   means for latching the serial data at the timing of the output signal of the voltage controlled oscillator;
   a phase comparator for comparing the serial data from the delay element and the latched serial data from the latching means and generating a detection signal representing a phase difference therebetween; and
   means for feed-backing the detection signal to the voltage controlled oscillator as the control signal voltage to minimize the phase difference detected by the phase comparator;
   wherein said predetermined delay time by said delay element is adjusted so that timings of the serial data from the delay element and the latched serial data from the latching means are equivalent to one another; and
   wherein said phase comparator detects the phase difference by comparing edges of the time periods in the serial data, thereby increasing a phase detection gain.

2. A clock signal extraction circuit as defined in claim 1, wherein the phase comparator compares the phase between either leading or trailing edge of the serial data from the delay element and the latched serial data from the latching means and generates the detection signal representing the phase difference therebetween.

3. A clock signal extraction circuit as defined in claim 1, wherein the phase comparator compares the phase between both leading and trailing edges of the serial data from the delay element and the latched serial data from the latching means and generates the detection signal representing the phase difference therebetween.

4. A clock signal extraction circuit as defined in claim 1, wherein the serial data received at the input terminal has an RZ (return-to-zero) waveform.

5. A clock signal extraction circuit as defined in claim 1, wherein the voltage controlled oscillator is an LC or RC oscillator whose oscillation frequency is varied by regulating a voltage supplied to a variable capacitor diode therein.

6. A clock signal extraction circuit as defined in claim 1, wherein the voltage controlled oscillator is a voltage tuned crystal oscillator.

7. A clock signal extraction circuit, comprising:
- an input terminal for receiving serial data having time periods each being an integer multiple of a fundamental time period of a clock signal to be reproduced;
- a delay element for providing a predetermined delay time to the serial data from the input terminal;
- a voltage controlled oscillator whose oscillation frequency is regulated by a control signal voltage for producing the clock signal;
- a flip-flop circuit provided with the serial data from the input terminal and the output signal of the voltage controlled oscillator for latching the serial data at the timing of the output signal of the voltage controlled oscillator;
- a phase comparator for comparing the serial data from the delay element and the latched serial data from the flip-flop circuit and generating a detection signal representing a phase difference therebetween; and
- means for feed-backing the detection signal to the voltage controlled oscillator as the control signal voltage to minimize the phase difference between detected by the phase comparator;
- wherein said predetermined delay time by said delay element is adjusted to be greater than a sum of a set-up time and a signal propagation delay time of the flip-flop circuit and a length of jitter superimposed on the serial data; and
- wherein said phase comparator detects the phase difference by comparing edges of the time periods in the serial data, thereby increasing a phase detection gain.

8. A clock signal extraction circuit as defined in claim 7, wherein the phase comparator compares the phase between either leading or trailing edge of the serial data from the delay element and the latched serial data from the flip-flop circuit and generates the detection signal representing the phase difference therebetween.

9. A clock signal extraction circuit as defined in claim 7, wherein the phase comparator compares the phase between both leading and trailing edges of the serial data from the delay element and the latched serial data from the flip-flop circuit and generates the detection signal representing the phase difference therebetween.

10. A clock signal extraction circuit as defined in claim 7, wherein the serial data received at the input terminal has an RZ (return-to-zero) waveform.

11. A clock signal extraction circuit as defined in claim 7, wherein the voltage controlled oscillator is an LC or RC oscillator whose oscillation frequency is varied by regulating a voltage supplied to a variable capacitor diode therein.

12. A clock signal extraction circuit as defined in claim 7, wherein the voltage controlled oscillator is a voltage tuned crystal oscillator.

13. A clock signal extraction circuit, comprising:
- an input terminal for receiving serial data having time periods each being an integer multiple of a fundamental time period of a clock signal to be reproduced;
- a delay element for providing a predetermined delay time to the serial data from the input terminal;
- a voltage controlled oscillator whose oscillation frequency is regulated by a control signal voltage for producing the clock signal;
- a frequency divider for dividing the oscillation frequency of the voltage controlled oscillator by a predetermined division ratio;
- a flip-flop circuit provided with the serial data from the input terminal and the output signal of the voltage controlled oscillator for latching the serial data at the timing of the output signal of the voltage controlled oscillator;
- a phase comparator for comparing the serial data from the delay element and the latched serial data from the flip-flop circuit and generating a detection signal representing a phase difference therebetween; and
- means for feed-backing the detection signal to the voltage controlled oscillator as the control signal voltage to minimize the phase difference detected by the phase comparator;
- wherein said predetermined delay time by said delay element is adjusted to be greater than a sum of a set-up time and a signal propagation delay time of the flip-flop circuit and a length of jitter superimposed on the serial data; and
- wherein said phase comparator detects the phase difference by comparing edges of the time periods in the serial data, thereby increasing a phase detection gain.

14. A clock signal extraction circuit as defined in claim 13, wherein the phase comparator compares the phase between either leading or trailing edge of the serial data from the delay element and the latched serial data from the flip-flop circuit and generates the detection signal representing the phase difference therebetween.

15. A clock signal extraction circuit as defined in claim 13, wherein the phase comparator compares the phase between both leading and trailing edges of the serial data from the delay element and the latched serial data from the flip-flop circuit and generates the detection signal representing the phase difference therebetween.

16. A clock signal extraction circuit as defined in claim 13, wherein the serial data received at the input terminal has an RZ (return-to-zero) waveform.

17. A clock signal extraction circuit as defined in claim 13, wherein the voltage controlled oscillator is an LC or RC oscillator whose oscillation frequency is varied by regulating a voltage supplied to a variable capacitor diode therein.

18. A clock signal extraction circuit as defined in claim 13, wherein the voltage controlled oscillator is a voltage tuned crystal oscillator.

\* \* \* \* \*